United States Patent
Sahota et al.

(10) Patent No.: US 6,773,988 B1
(45) Date of Patent: Aug. 10, 2004

(54) MEMORY WORDLINE SPACER

(75) Inventors: Kashmir S. Sahota, Fremont, CA (US); Tazrien Kamal, San Jose, CA (US); Mark T. Ramsbey, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 126 days.

(21) Appl. No.: 10/243,108

(22) Filed: Sep. 13, 2002

(51) Int. Cl.⁷ .................. H01L 21/8234; H01L 21/336
(52) U.S. Cl. ............... 438/257; 438/216; 438/261; 438/591; 438/593
(58) Field of Search ............... 438/216, 257, 438/258, 261, 591, 593, 655

(56) References Cited

U.S. PATENT DOCUMENTS

| | | | | |
|---|---|---|---|---|
| 6,472,706 B2 | * | 10/2002 | Widdershoven et al. | .... 257/314 |
| 6,482,708 B2 | * | 11/2002 | Choi et al. | ................... 438/303 |
| 6,492,675 B1 | * | 12/2002 | Van Buskirk et al. | ...... 257/314 |
| 6,492,730 B1 | * | 12/2002 | Nakamura et al. | .......... 257/758 |
| 6,570,211 B1 | * | 5/2003 | He et al. | ..................... 257/314 |
| 6,570,790 B1 | * | 5/2003 | Harari | ................... 365/185.29 |
| 6,593,624 B2 | * | 7/2003 | Walker | ........................ 257/344 |
| 6,605,530 B2 | * | 8/2003 | Nakamura et al. | .......... 438/627 |
| 6,645,801 B1 | * | 11/2003 | Ramsbey et al. | ........... 438/216 |
| 6,686,242 B2 | * | 2/2004 | Willer et al. | ................ 438/257 |
| 6,707,079 B2 | * | 3/2004 | Satoh et al. | ................ 257/288 |

* cited by examiner

*Primary Examiner*—Michael Lebentritt
(74) *Attorney, Agent, or Firm*—Mikio Ishimaru

(57) ABSTRACT

A manufacturing method for a memory and a memory made thereby includes providing a semiconductor substrate and depositing a charge-trapping dielectric layer. First and second bitlines are implanted and a wordline layer is deposited and formed. A doped wordline spacer layer is deposited and a doped wordline spacer is formed adjacent to the wordline.

14 Claims, 5 Drawing Sheets

MEMORY WORDLINE SPACER

BACKGROUND OF THE INVENTION

1. Technical Field

The present invention relates generally to semiconductor technology and more specifically to manufacturing semiconductor memory.

2. Background Art

Different types of memories have been developed in the past as electronic, memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell is known as "MirrorBit®" Flash memory has been developed. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

A major problem with the MirrorBit architecture has been discovered in forming uniform and closely spaced wordlines by processes compatible with the materials used.

A solution to this problem has been long sought but has long eluded those skilled in the art.

DISCLOSURE OF THE INVENTION

The present invention provides a manufacturing method for a memory and a memory made thereby, which includes providing a semiconductor substrate and depositing a charge-trapping dielectric layer. First and second bitlines are implanted and a wordline layer is deposited and formed into a doped wordline. A doped wordline spacer layer is deposited and a doped wordline spacer is formed adjacent to the doped wordline. This provides uniform and closely spaced wordlines by processes compatible with the materials used.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
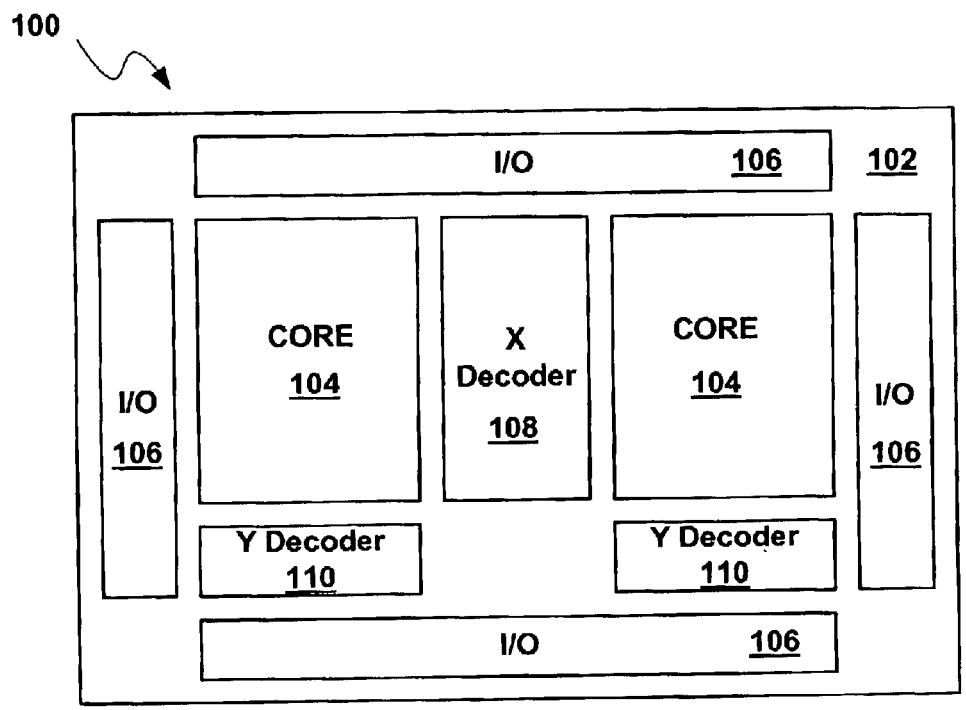
FIG. 1 is a plan view of a MirrorBit Flash EEPROM.

Referring now to FIG. 1, therein is shown a plan view of a MirrorBit® Flash EEPROM 100, which commonly includes a semiconductor substrate 102 in which one or more high-density core regions and one or more low-density peripheral portions are formed. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "side" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
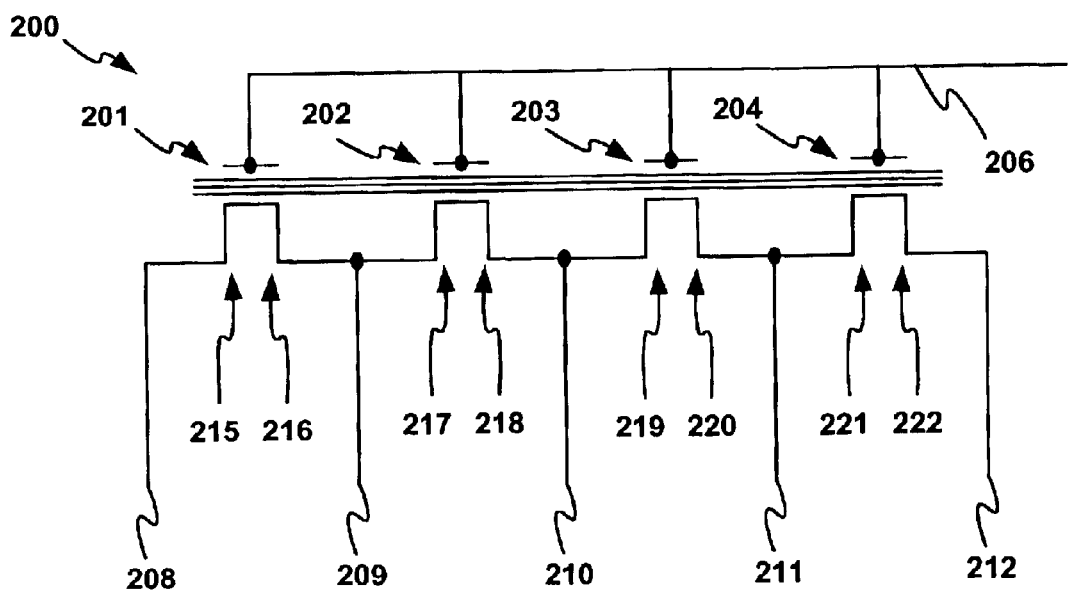
FIG. 2 is a circuit schematic of a portion of one of the M×N array cores of FIG. 1.

Referring now to FIG. 2, therein is shown a circuit schematic of a portion of one of the M×N array cores 104 of FIG. 1. The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209 and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, programming of the bit at location 215 is achieved through connection of the drain to the bitline 208 and the source to the bitline 209 and reading of the bit at location 215 is achieved through connection of the drain to the bitline 209 and the source to the bitline 208. Similarly, programming of the bit at location 216 is achieved through connection of the drain to the bitline 209 and the source to the bitline 208 and reading of the bit at location 216 is achieved through connection of the drain to the bitline 208 and the source to the bitline 209. Although adjacent memory cells share common bitlines, the adjacent memory cells do not interfere with each other because the memory cells are programmed one at a time and only one memory cell is active at a time while programming.

Figure 3:
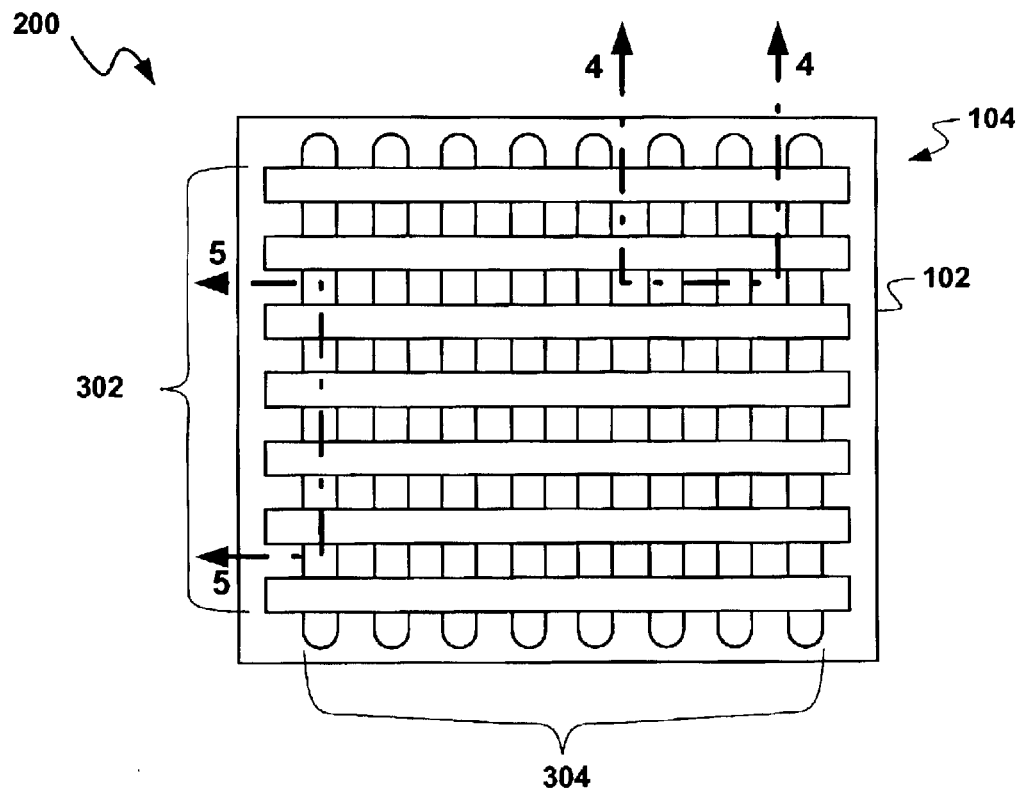
FIG. 3 is a plan view of a portion of one of the M×N array cores 104 of FIG. 1.

Referring now to FIG. 3, therein is shown a plan view of a portion of one of the M×N array cores 104 of FIG. 1. The semiconductor substrate 102 has a plurality of implanted bitlines 304 extending in parallel. The semiconductor substrate 102 also has a plurality of wordlines 302 extending in parallel. The plurality of wordline 302 is at right angles to the plurality of implanted bitlines 304. The pluralities of wordlines 302 and bitlines 304 have contacts and interconnections (not shown) to the programming circuitry represented in part by x-decoders 108 and y-decoders 110 of FIG. 1.

Figure 4:
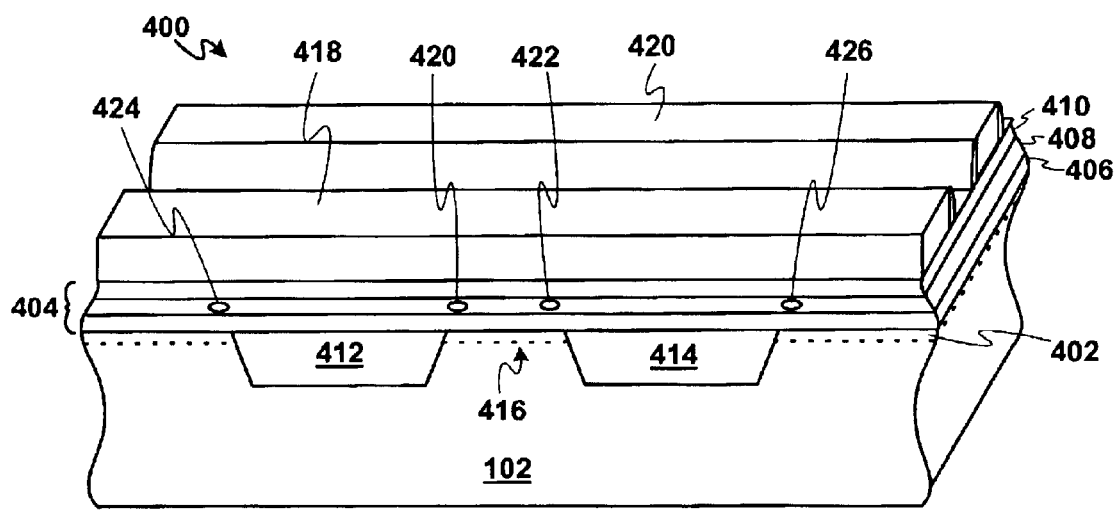
FIG. 4 is a cross-sectional isometric view of a typical MirrorBit Flash memory cell along the line 4—4 of FIG. 3.

Referring now to FIG. 4, therein is shown a cross-sectional isometric view of a typical MirrorBit Flash memory cell along the line 4—4 of FIG. 3, such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric such as silicon dioxide ($SiO_2$) and the charge-trapping layer 408 is of a nitride dielectric such as silicon nitride ($Si_xN_y$). The oxide-nitride-oxide configuration is frequently referred to as a matter of convenience as an "ONO layer".

The bitlines 304 of FIG. 3 are implanted under the charge-trapping dielectric layer 404 in the semiconductor substrate 102 as typified by first and second conductive bitlines 412 and 414. They are typically of an implanted n-type material, such as arsenic, and can include an oxide portion (not shown) in some embodiments. The first and second conductive bitlines 412 and 414 are spaced apart and define a volume between them with the threshold adjustment implant 402, which is a channel 416.

A material, such as polysilicon, is deposited over the charge-trapping dielectric layer 404, patterned, etched, and stripped resulting in a wordline 418. The wordline 418 is one of the wordlines 302 in FIG. 3.

It is understood that the implementation of each step in manufacturing has associated processing steps.

Locations 420 through 422 indicate where bits can be stored in the memory cell 400 and locations 424 and 426 are adjacent locations, which are independent of the memory cell 400.

Figure 5:
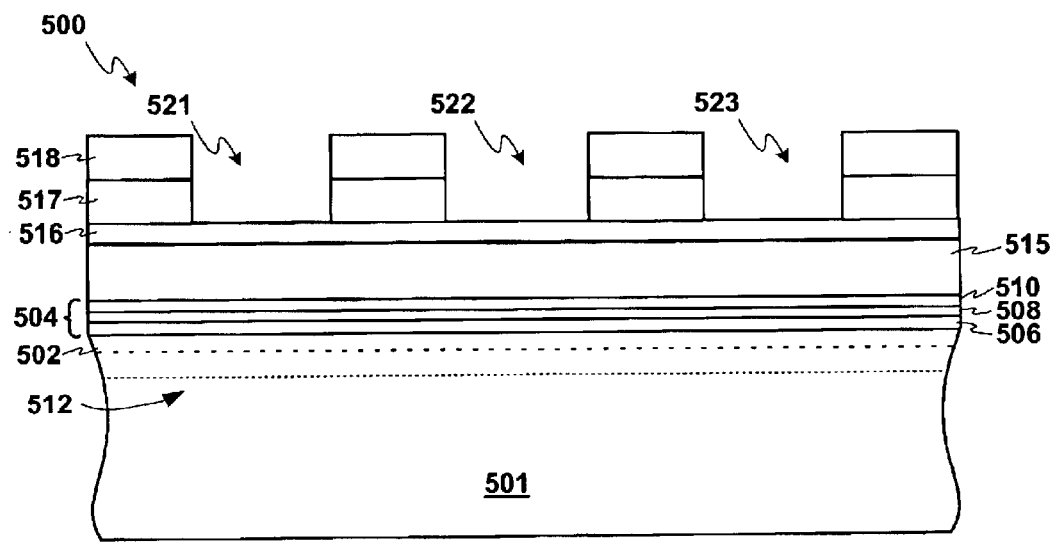
FIG. 5 is a cross-sectional view of a partially processed memory cell similar to a cross-sectional view along line 5—5 in FIG. 3.

Referring now to FIG. 5, therein is shown a cross-sectional view of a partially processed memory cell 500 similar to a cross-sectional view along line 5—5 in FIG. 3. A p-type silicon substrate 501 has been implanted or processed with a p-type threshold adjustment implant 502.

A charge-trapping dielectric layer 504 is deposited over the silicon substrate 501. The charge-trapping dielectric layer 504 generally can be composed of three separate layers: a first insulating layer 506, a charge-trapping layer 508, and a second insulating layer 510. The first and second insulating layers 506 and 510 may be of an oxide dielectric such as silicon dioxide ($SiO_2$) and the charge-trapping layer 508 may be of a nitride dielectric such as silicon nitride ($Si_xN_y$) to form an ONO layer. It will be noted that the present invention is not limited to specific dielectric or charge-trapping materials.

The bitlines, as typified by a first n-type bitline 512, are implanted under the charge-trapping dielectric layer 504 in the silicon substrate 501. It will be noted that the present invention is not limited to specific bitline type.

A wordline material 515, such as polysilicon, has been deposited over the charge-trapping dielectric layer 504. The material can be undoped when deposited and later doped or a doped material can be deposited.

Although conventional processes can be used to form the wordlines, in one embodiment, an optional hard mask layer 516 has been deposited over the wordline material 515 and has not been processed. The hard mask layer 516 can act as an ARC or an ARC can be deposited as a separate layer, such as an optional ARC layer 517.

A photoresist 518 has been deposited over the hard mask layer 516 or the ARC layer 517. The ARC layer 517, the hard mask layer 516 and the photoresist 518 have been processed to form openings 521 through 523 to expose the hard mask layer 516.

In FIG. 5, both the photoresist 518 and the ARC layer 517 have been processed (i.e., the materials have been deposited, masked, patterned, exposed, and etched) for processing the hard mask layer 516.

Figure 6:
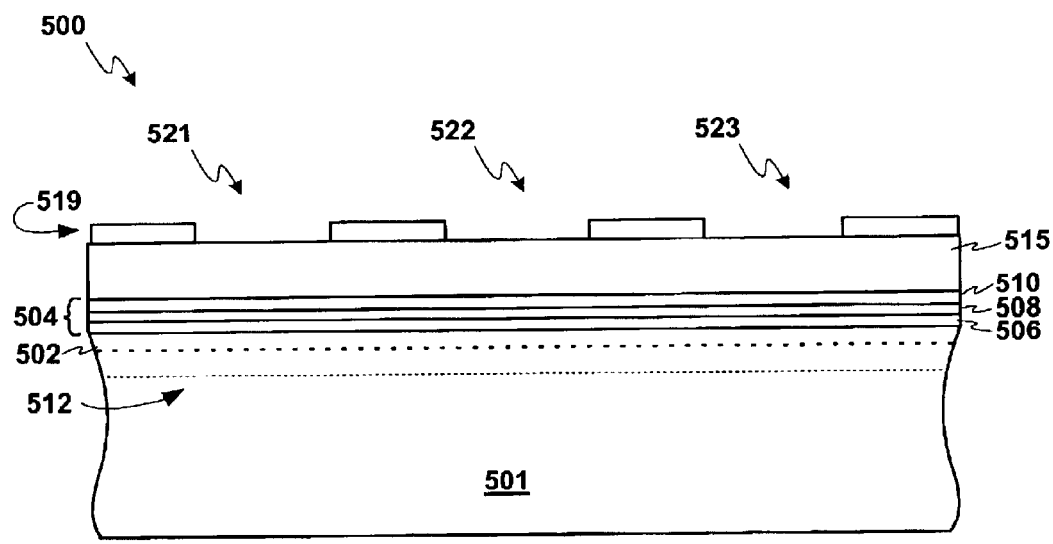
FIG. 6 is the structure of FIG. 5 after formation of an optional hard mask and removal of the photoresist and the ARC layer.

Referring now to FIG. 6, therein is shown the structure of FIG. 5 after formation of a hard mask 519 and removal of the photoresist 518 and the ARC layer 517. The hard mask 519 is used to create the structure of FIG. 7.

Figure 7:
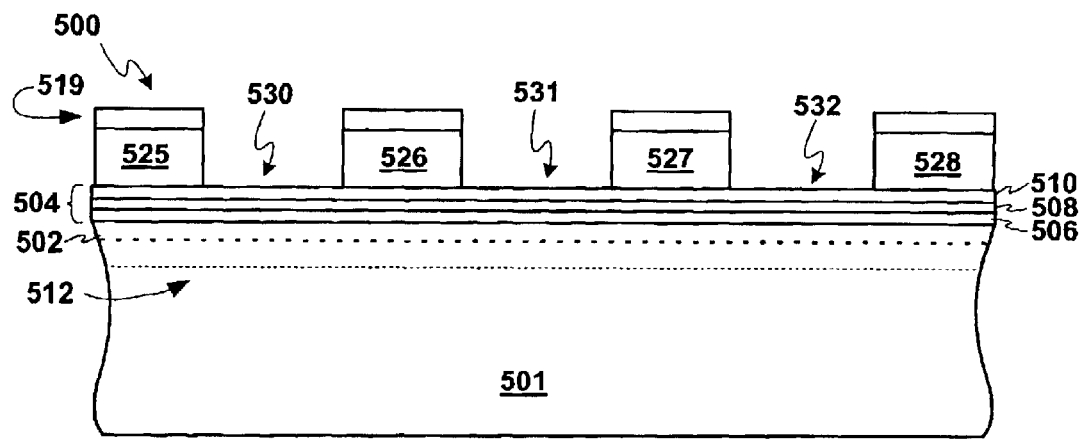
FIG. 7 is the structure of FIG. 6 after processing using the hard mask to form wordlines.

Referring now to FIG. 7, therein is shown the structure of FIG. 6 after processing using the hard mask 519 to form wordlines 525 through 528.

Figure 8:
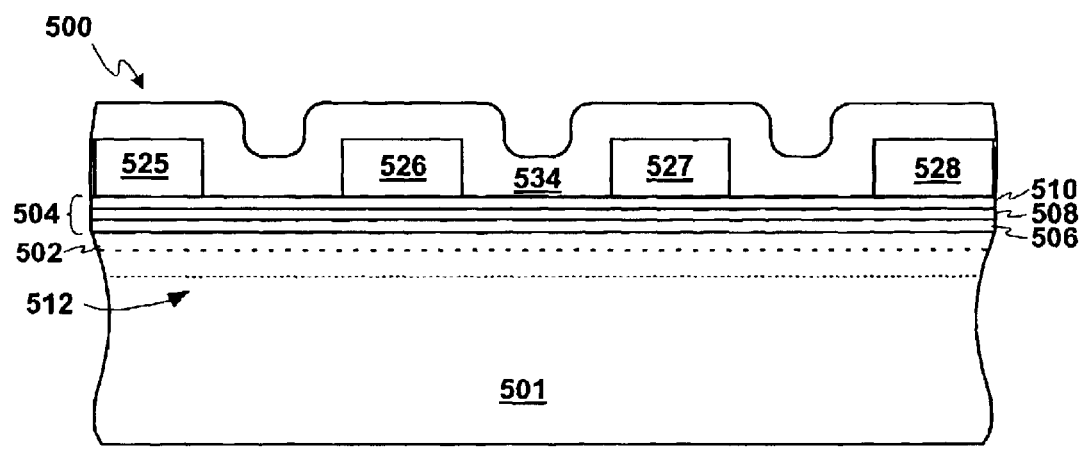
FIG. 8 is the structure of FIG. 7 after deposition of a doped wordline spacer material.

Referring now to FIG. 8 therein is shown the structure of FIG. 7 after removal of the hard mask 519. A doped wordline spacer material 534, such as doped polysilicon has been deposited. The wordline spacer material is doped to substantially match the doping of the wordlines.

Figure 9:
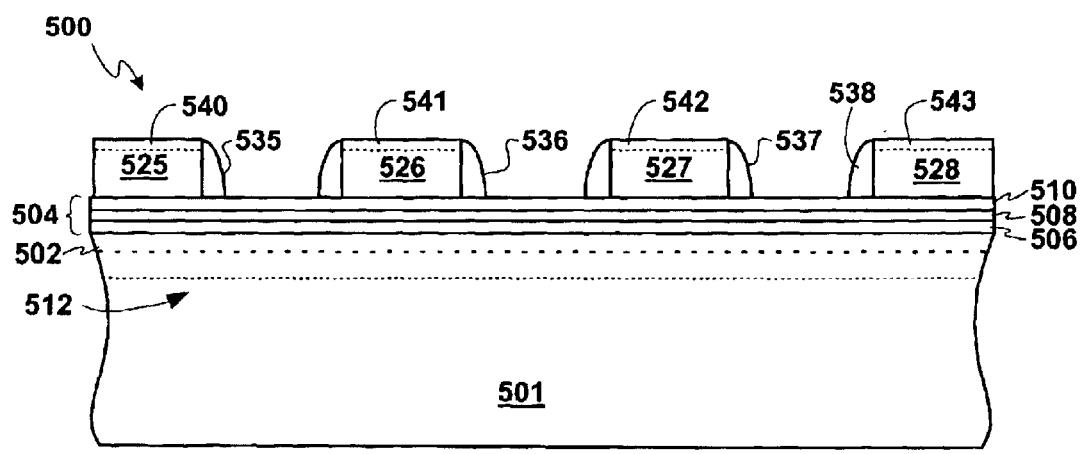
FIG. 9 is the structure of FIG. 8 after forming of the doped wordline spacers.

Referring now to FIG. 9, therein is shown the structure of FIG. 8 after etching of the doped wordline spacer material 534 to form doped wordline spacers 535 through 538 adjacent to the wordlines 525 through 528, respectively. The doping of the doped wordline spacers 535 through 538 effectively create wordlines which are closer together since the wordline width will be the combination of the widths of the wordline and the doped wordline spacer rather than the width of a doped wordline alone.

An optional anneal can be performed to equalize the doping between the wordlines 525 through 528 and the wordline spacers 535 through 538.

The memory cell 500 is also shown after application of a saliciding process to grow metal salicides 540 through 543, such as cobalt silicide, titanium silicide, or nickel silicide contacts on top of the wordlines 525 through 528, respectively.

Since the metal silicide will not form on the exposed ONO layer or the nitride spacers, which do not contain silicon, the metal silicide will be self-aligned on the tops of the polysilicon wordlines; i.e., salicide will be grown.

Figure 10:
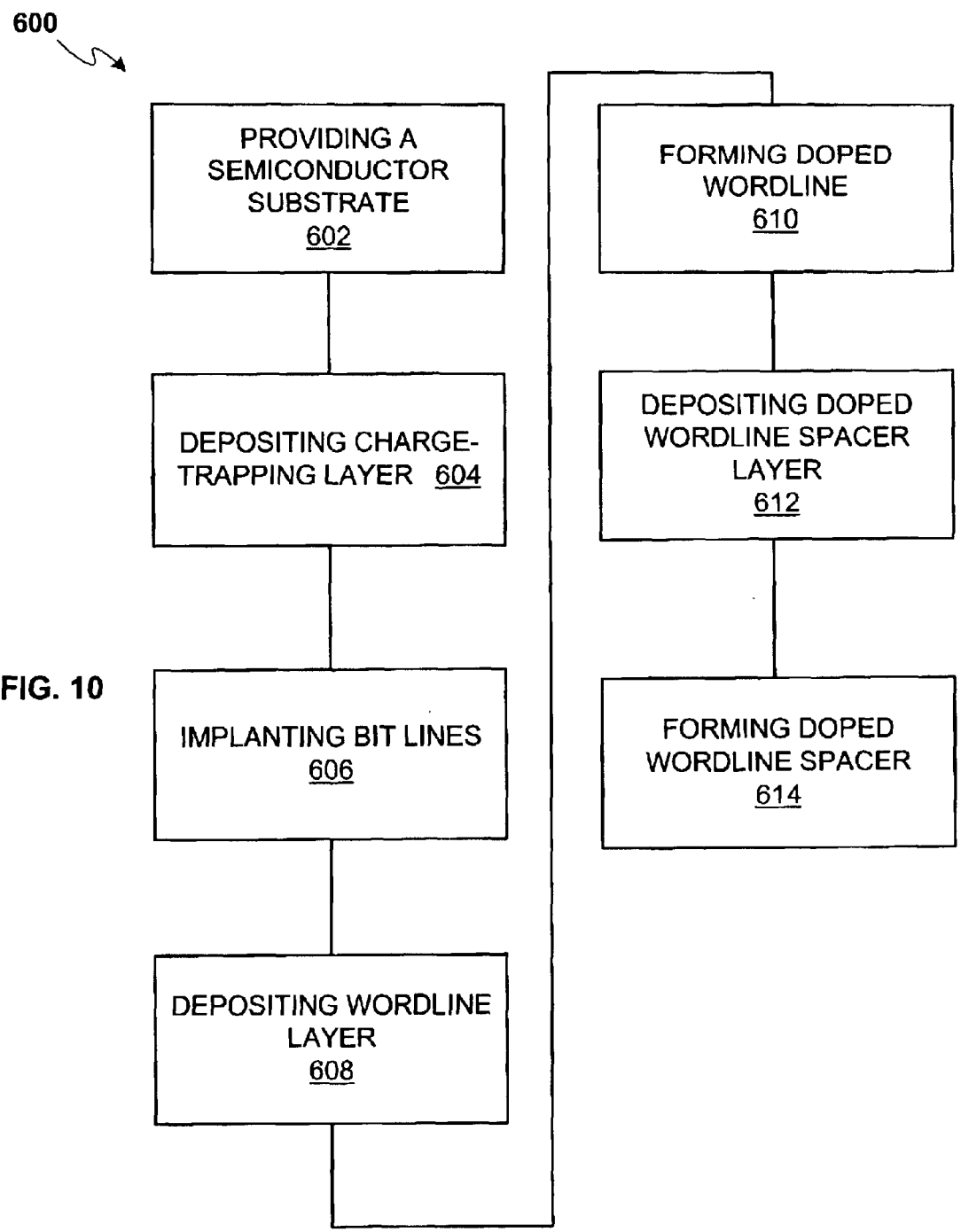
FIG. 10 is shown a simplified process chart according to the present invention.

Referring now to FIG. 10, therein is shown a simplified process chart 600 of the present invention which includes: providing a semiconductor substrate 602; depositing charge-trapping dielectric layer 604; implanting bitlines 606; depositing wordline layer 608; forming doped wordline 610; depositing doped wordline spacer layer 612, and forming doped wordline spacer 614. Conventional processes will be used to complete the integrated circuit. Various alternative sequences, additions, and deletions to this process chart would be obvious to those skilled in the art from a detailed reading of the present disclosure to complete the integrated circuit.

Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope and equivalents of the included claims. All matters hither-to-fore set forth or shown in the accompanying drawings are to be interpreted in an illustrative and non-limiting sense.

What is claimed is:

1. A method of manufacturing an integrated circuit comprising:

providing a semiconductor substrate;

forming a charge-trapping dielectric layer over the semiconductor substrate;

forming first and second bitlines in the semiconductor substrate;

forming a wordline layer over the charge-trapping dielectric layer;

forming the wordline layer to form a doped wordline;

forming a doped wordline spacer layer over the doped wordline; and forming a doped wordline spacer adjacent to the doped wordline.

2. The method of manufacturing an integrated circuit as claimed in claim 1 wherein:
   forming the wordline layer includes:
   depositing an undoped wordline material; and
   doping the undoped wordline material.

3. The method of manufacturing an integrated circuit as claimed in claim 1 wherein forming the wordline spacer layer deposits a doped material.

4. The method of manufacturing an integrated circuit as claimed in claim 1 including annealing the doped wordline and the doped wordline spacer.

5. The method of manufacturing an integrated circuit as claimed in claim 1 including:
   depositing a hard mask layer over the wordline layer;
   processing the hard mask layer into a hard mask for patterning the wordline layer; and
   removing the hard mask.

6. The method of manufacturing an integrated circuit as claimed in claim 1 additionally comprising siliciding the doped wordline.

7. The method of manufacturing an integrated circuit as claimed in claim 1 wherein depositing the charge-trapping dielectric layer deposits:
   a first dielectric layer;
   a charge-trapping layer over the first dielectric layer; and
   a second dielectric layer over the charge-trapping layer.

8. A method of manufacturing an integrated circuit comprising:
   providing a silicon substrate;
   depositing a charge-trapping dielectric layer over the silicon substrate;
   forming first and second bitlines in the silicon substrate;
   forming a doped wordline layer over the charge-trapping dielectric layer;
   depositing a photoresist layer over the doped wordline layer;
   processing and patterning the photoresist layer;
   using the patterned photoresist layer to form a doped wordline;
   removing the patterned photoresist layer;
   depositing a doped wordline spacer layer over the doped wordline; and
   forming a doped wordline spacer adjacent to and around the wordline.

9. The method of manufacturing an integrated circuit as claimed in claim 8 wherein:
   forming the wordline layer includes:
   depositing an undoped polysilicon; and
   doping the undoped polysilicon.

10. The method of manufacturing an integrated circuit as claimed in claim 8 wherein forming the wordline spacer layer deposits a doped polysilicon.

11. The method of manufacturing an integrated circuit as claimed in claim 8 including annealing the doped wordline and the doped wordline spacer to equalize the doping therein.

12. The method of manufacturing an integrated circuit as claimed in claim 8 including:
   depositing a hard mask layer over the wordline layer;
   forming the hard mask layer using an anti-reflective coating layer into a hard mask for patterning the wordline layer; and
   removing the hard mask.

13. The method of manufacturing an integrated circuit as claimed in claim 8 additionally comprising:
   forming a self-align silicide on top of the doped wordline of cobalt, titanium, or nickel silicide.

14. The method of manufacturing an integrated circuit as claimed in claim 8 wherein depositing the charge-trapping dielectric layer deposits:
   a first oxide layer;
   a nitride layer over the first oxide layer; and
   a second oxide layer over the nitride layer.

* * * * *